United States Patent
Tang

(10) Patent No.: US 11,742,245 B2
(45) Date of Patent: Aug. 29, 2023

(54) SEMICONDUCTOR FABRICATION METHOD AND STRUCTURE USING MULTIPLE SACRIFICIAL LAYERS TO FORM SIDEWALL SPACERS

(71) Applicants: Semiconductor Manufacturing International (Shanghai) Corporation, Shanghai (CN); Semiconductor Manufacturing International (Beijing) Corporation, Beijing (CN)

(72) Inventor: Poren Tang, Beijing (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 73 days.

(21) Appl. No.: 17/445,328

(22) Filed: Aug. 18, 2021

(65) Prior Publication Data

US 2021/0384079 A1  Dec. 9, 2021

Related U.S. Application Data

(62) Division of application No. 16/433,701, filed on Jun. 6, 2019, now Pat. No. 11,127,638.

(30) Foreign Application Priority Data

Jun. 7, 2018 (CN) .......................... 201810586724.7

(51) Int. Cl.
*H01L 21/8234* (2006.01)
*H01L 29/66* (2006.01)
(Continued)

(52) U.S. Cl.
CPC .. *H01L 21/823468* (2013.01); *H01L 21/0332* (2013.01); *H01L 21/0337* (2013.01);
(Continued)

(58) Field of Classification Search
CPC ..... H01L 21/823468; H01L 21/823431; H01L 21/823437; H01L 21/76829; H01L 29/6653; H01L 29/66795; H01L 29/7851
(Continued)

(56) References Cited

U.S. PATENT DOCUMENTS

2015/0243544 A1* 8/2015 Alptekin ............. H01L 21/7682
438/586
2015/0357440 A1  12/2015 Cheng et al.
(Continued)

FOREIGN PATENT DOCUMENTS

CN  105789312 A  7/2016
CN  107275281 A  10/2017

*Primary Examiner* — Matthew E. Gordon
(74) *Attorney, Agent, or Firm* — Anova Law Group, PLLC

(57) ABSTRACT

Semiconductor devices fabrication method is provided. The method for fabricating the semiconductor device includes: providing a semiconductor substrate; forming a gate structure on a surface of the semiconductor substrate; forming protective sidewall spacers on sidewall surfaces of the gate structure and to cover sidewall surfaces of the gate dielectric layer; forming sacrificial sidewall spacers on sidewall surfaces of the protective sidewall spacers and between the protective sidewall spacers and the gate structure; forming a first dielectric layer on the surface of the semiconductor substrate around the gate structure, the protective sidewall spacers and the sacrificial sidewall spacers; forming conductive plugs in the first dielectric layer at opposite sides of the gate structure, the protective sidewall spacers and the sacrificial sidewall spacers; and removing the sacrificial
(Continued)

sidewall spacers to form air gap spacers between the protective sidewall spacers and the conductive plugs.

9 Claims, 10 Drawing Sheets

(51) Int. Cl.
     *H01L 21/033*      (2006.01)
     *H01L 21/768*      (2006.01)
     *H01L 29/78*      (2006.01)

(52) U.S. Cl.
     CPC ............... *H01L 21/76829* (2013.01); *H01L 21/823431* (2013.01); *H01L 21/823437* (2013.01); *H01L 29/6653* (2013.01); *H01L 29/66795* (2013.01); *H01L 29/7851* (2013.01)

(58) Field of Classification Search
     USPC ........................................................ 257/368
     See application file for complete search history.

(56)               References Cited

U.S. PATENT DOCUMENTS

| | | |
|---|---|---|
| 2018/0138280 A1 | 5/2018 | Li et al. |
| 2018/0166319 A1 | 6/2018 | Park et al. |
| 2019/0172752 A1 | 6/2019 | Hsu et al. |
| 2019/0334008 A1 | 10/2019 | Chen et al. |

\* cited by examiner

SEMICONDUCTOR FABRICATION METHOD AND STRUCTURE USING MULTIPLE SACRIFICIAL LAYERS TO FORM SIDEWALL SPACERS

CROSS-REFERENCES TO RELATED APPLICATIONS

This application is a divisional of U.S. patent application Ser. No. 16/433,701, filed on Jun. 6, 2019, which claims the priority of Chinese patent application No. 201810586724.7, filed on Jun. 7, 2018, the entirety of which is incorporated herein by reference.

FIELD OF THE DISCLOSURE

The present disclosure generally relates to the field of semiconductor manufacturing and, more particularly, relates to semiconductor devices and fabrication methods.

BACKGROUND

MOS transistors are the important components of integrated circuits (ICs). The basic structure of a MOS transistor includes a semiconductor substrate, a gate structure on the surface of the semiconductor substrate, a source region formed in the semiconductor substrate at one side of the gate structure and a drain region formed in the semiconductor substrate at another side of the gate structure.

The working mechanism of the MOS transistor is to adjust the current of the channel region under the gate structure to generate switching signals by applying a voltage on the gate structure.

However, it is still desirable to improve the performance of MOS transistors. The disclosed methods and semiconductor structures are directed to solve one or more problems in the art.

BRIEF SUMMARY OF THE DISCLOSURE

One aspect of the present disclosure includes a method for fabricating a semiconductor device. The method includes providing a semiconductor substrate; forming at least one gate structure having a gate dielectric layer on a surface of the semiconductor substrate, wherein sidewall surfaces of the gate structure includes a first sidewall surface region and a second sidewall surface region above the first sidewall surface region; forming first sidewall spacers on the first sidewall surface region of the gate structure and covering sidewall surfaces of the gate dielectric layer; forming second sidewall spacers on the second sidewall surface region and top surfaces of first sidewall spacers, and made of a material different from a material of the first sidewall spacers; forming a first dielectric layer on the surface of the semiconductor substrate around the gate structure, the first sidewall spacers and the second sidewall spacers; forming conductive plugs in the first dielectric layer at both sides of the gate structure, the first sidewall spacers and the second sidewall spacers; and removing the second sidewall spacers to form air gap spacers above the first sidewall spacers and between the second sidewall surface region of the gate structure and the conductive plugs.

Another aspect of the present disclosure includes a semiconductor device. The semiconductor device includes a semiconductor substrate; a gate structure including a gate dielectric layer formed on a surface of the semiconductor substrate, wherein sidewall surfaces of the gate structure includes a first sidewall surface region and a second sidewall surface region above the first sidewall surface region; first sidewall spacers formed on the first sidewall surface region of the gate structure and covering sidewall surfaces of the gate dielectric layer; a first dielectric layer formed on the surface of the semiconductor substrate around the gate structure and the first sidewall spacers; conductive plugs formed in the first dielectric layer at both sides of the gate structure and the first sidewall spacers; and air gap spacers formed between the second sidewall surface region and the conductive plugs and above the first sidewall spacers.

Another aspect of the present disclosure includes a method for forming a semiconductor device. The method includes providing a semiconductor substrate; forming a gate structure on a surface of the semiconductor substrate, wherein the gate structure includes a gate dielectric layer on the surface of the semiconductor substrate; forming protective sidewall spacers on sidewall surfaces of the gate structure and to cover sidewall surfaces of the gate dielectric layer; forming sacrificial sidewall spacers on sidewall surfaces of the protective sidewall spacers and between the protective sidewall spacers and the gate structure, wherein the sacrificial sidewall spacers and the protective sidewall spacers are made of different materials; forming a first dielectric layer on the surface of the semiconductor substrate around the gate structure, the protective sidewall spacers and the sacrificial sidewall spacers; forming conductive plugs in the first dielectric layer at both sides of the gate structure, the protective sidewall spacers and the sacrificial sidewall spacers; and removing the sacrificial sidewall spacers to form air gap spacers between the protective sidewall spacers and the conductive plugs.

Another aspect of the present disclosure includes a semiconductor device. The semiconductor device includes a semiconductor substrate and a gate structure formed on a surface of the semiconductor substrate. The gate structure includes a gate dielectric layer formed on the surface of the semiconductor substrate. The semiconductor device may also include protective sidewall spacers formed on the sidewall surfaces of the gate structure and covering the sidewall surfaces of the gate dielectric layer; and a first dielectric layer formed on the surface of the semiconductor substrate around the gate structure and the protective sidewall spacers. Further, the semiconductor device includes conductive plugs formed in the first dielectric layer at both sides of the gate structure and the protective sidewall spacers; and air gap spacers formed between the protective sidewall spacers and the conductive plugs and exposing sidewall surfaces of the protective sidewall spacers.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
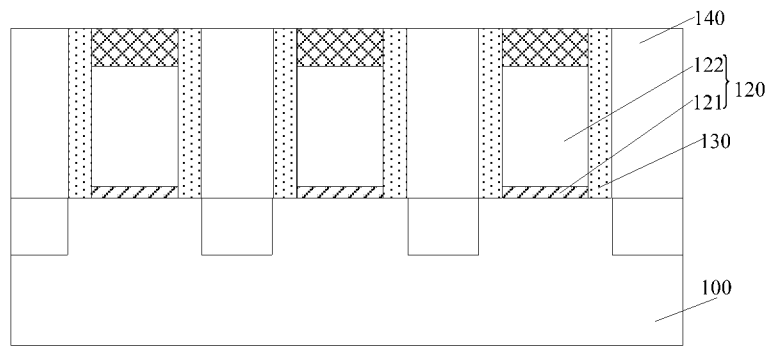
FIGS. 1-2 illustrate structures corresponding to certain stages during a fabrication process of a semiconductor device.
Figure 2:
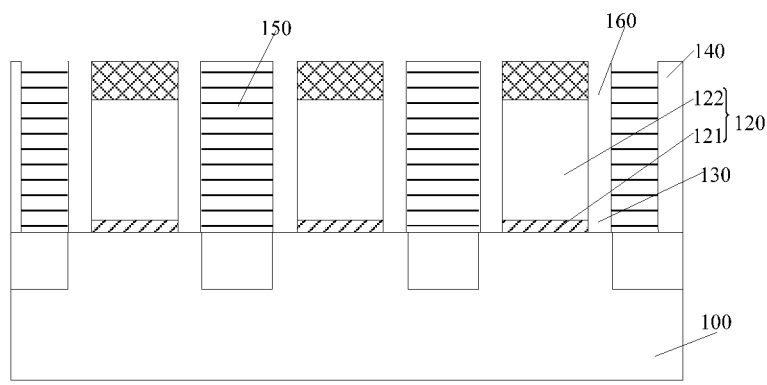

FIGS. 1-2 illustrate structures corresponding to certain stages during a fabrication process of a semiconductor device.

As shown in FIG. 1, the fabrication process includes providing a semiconductor substrate 100, and forming a gate structure 120, sidewall spacers 130 and a dielectric layer 140 over the semiconductor substrate 100. The gate structure 120 is formed on the semiconductor substrate 100. The sidewall spacers 130 are formed on the sidewall surfaces of the gate structure 120. The dielectric layer 130 is formed on the surface of the semiconductor substrate 100 around the gate structure 120 and the sidewall spacers 130.

The gate structure 130 includes a gate dielectric layer 121 on the surface of the semiconductor substrate 100 and a gate electrode layer 122 on the gate dielectric layer 121.

Further, as shown in FIG. 2, conductive plugs 150 are formed in the dielectric layer 140 at both sides of the gate structure 120 and the sidewall spacers 130. After forming the conductive plugs 150, the sidewall spacers 130 (referring to FIG. 1) are removed by an etching process; and air gap spacers 160 are formed between the gate structure 120 and the conductive plugs 150.

The air gap spacers are formed by removing the sidewall spacers, the air gap spacers expose the sidewall surfaces of the gate dielectric layer on the semiconductor substrate. Before removing the sidewall spacers by the etching process, the sidewall spacers cover the sidewall surfaces of the gate dielectric layer on the surface of the semiconductor substrate. Thus, the etching process for removing the sidewall spacers etches the sidewall surfaces of the gate dielectric layer on the surface of the semiconductor substrate; and the gate dielectric layer on the surface of the semiconductor is damaged. Accordingly, the interface status of the gate dielectric layer on the surface of the semiconductor substrate is increased. The gate dielectric layer on the surface of the semiconductor substrate plays an important role on the electrical properties of the semiconductor device, such as the leakage current, the threshold voltage, and the carrier mobility. Because the gate dielectric layer on the surface of the semiconductor substrate is damaged by the etching process, the leakage current is increased, the threshold voltage is not stable, and the carrier mobility is increased. Accordingly, the performance of the semiconductor device is not as desired.

The present disclosure provides a semiconductor device and a method for fabricating a semiconductor device. The method may include forming a gate structure, first sidewall spacers, second sidewall spacers and a first dielectric layer. The gate structure may be formed on a surface of a semiconductor substrate. The gate structure may include a gate dielectric layer on the surface of the semiconductor substrate. The sidewall surfaces of the gate structure may include a first sidewall surface region and a second sidewall surface region above the first sidewall surface region. The first sidewall spacers may be formed on the first sidewall surface region and may cover the sidewall surfaces of the gate dielectric layer. The second sidewall spacers may be formed on the second sidewall surface region and may be on the top surfaces of the first sidewall spacers. The first sidewall spacers and the second sidewall spacers may be made of different materials. The first dielectric layer may be formed on the surface of the semiconductor substrate around the gate structure, the first sidewall spacers and the second sidewall spacers. Further, conductive plugs may be formed in the first dielectric layer at both sides of the first sidewall spacers and the second sidewall spacers. Then, the second sidewall spacers may be removed to form air gap spacers above the first sidewall spacers and between the second sidewall surface region and the conductive plugs. The method may be able to improve the performance of the semiconductor devices.

Figure 25:
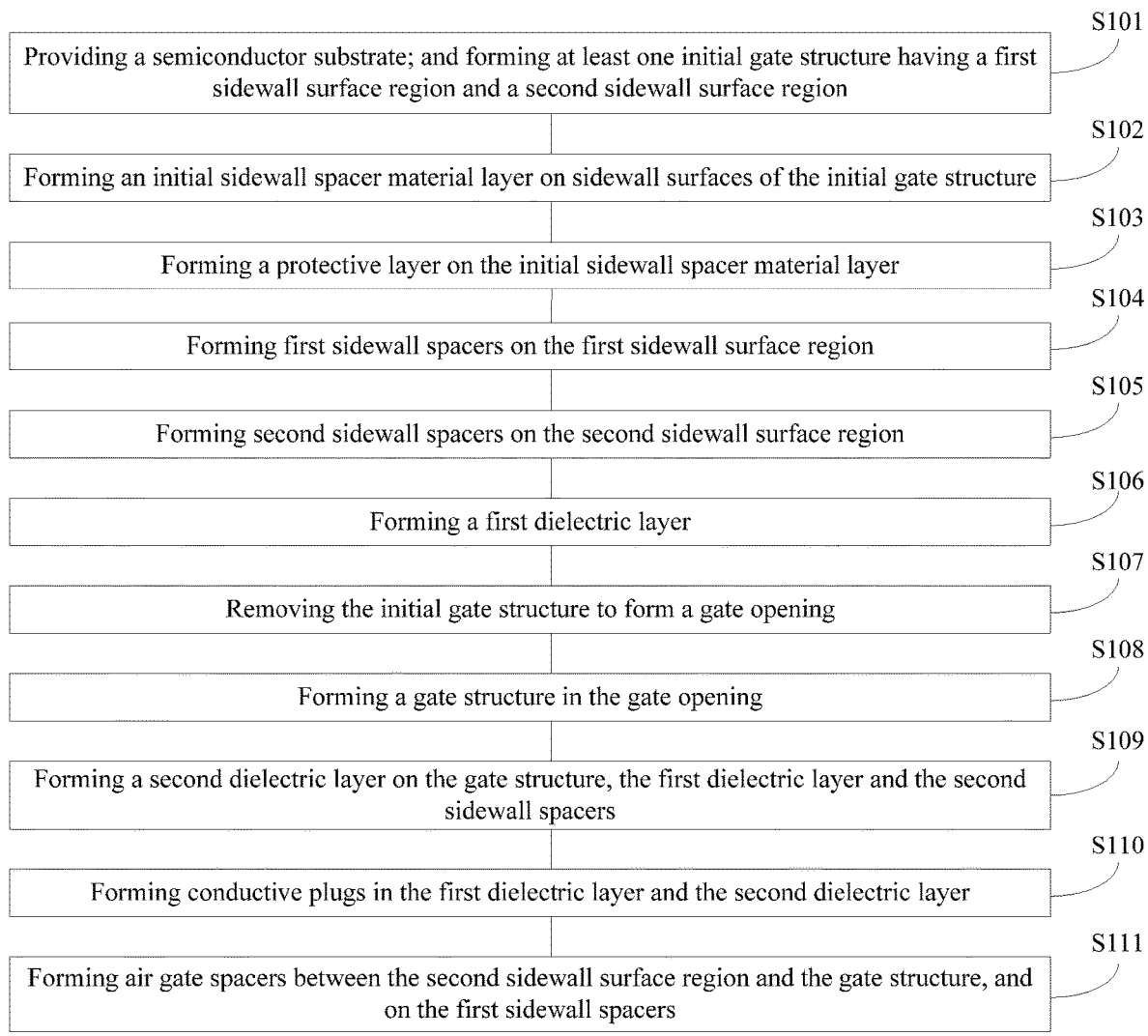
FIG. 25 illustrates an exemplary fabrication process of a semiconductor device consistent with various disclosed embodiments.

FIG. 25 illustrates an exemplary fabrication process of a semiconductor device consistent with various disclosed embodiments. FIGS. 3-17 illustrate structures corresponding to certain stages during an exemplary fabrication process of a semiconductor device consistent with various disclosed embodiments.

Figure 3:
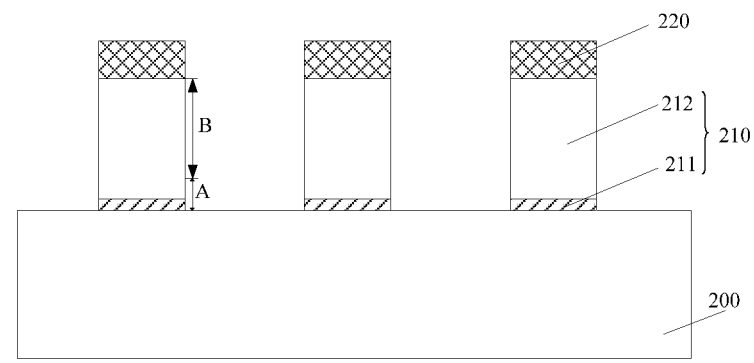
FIGS. 3-17 illustrate structures corresponding to certain stages during an exemplary fabrication process of a semiconductor device consistent with various disclosed embodiments.

As shown in FIG. 25, at the beginning of the fabrication process, a semiconductor substrate with certain structures is provided (S101). FIG. 3 illustrates a corresponding semiconductor structure.

As shown in FIG. 3, a semiconductor substrate 200 is provided. At least one initial gate structure 210 may be formed on a surface of the semiconductor substrate 200. For illustrative purposes, three initial gate structure 210 shown in FIG. 3. The sidewall surfaces of the initial gate structure 210 may include a first initial sidewall surface region A and a second initial sidewall surface region B above the first initial sidewall surface region A.

In one embodiment, for illustrative purposes the semiconductor device is a planar MOS transistor. Correspondingly, the semiconductor substrate 200 may be a planar semiconductor substrate. In some embodiments, the semiconductor device may be a fin field-effect transistor (FinFET). Correspondingly, the semiconductor substrate may include a base substrate and a plurality of fins on the base substrate.

In one embodiment, the semiconductor substrate 200 is made of silicon. The semiconductor substrate 200 may also be made of polysilicon, or amorphous silicon. In some embodiments, the semiconductor substrate may also be made of germanium, silicon germanium, or gallium arsenide, etc.

The initial gate structure 210 may include an initial gate dielectric layer 211 on the surface of the semiconductor substrate 200 and an initial gate electrode layer 212 on the initial gate dielectric layer 211. The initial gate dielectric layer 211 may be made of silicon oxide, or a high dielectric constant (high-K, i.e., K>3.9) dielectric material. The initial gate electrode layer 212 may be made of polysilicon, etc.

In one embodiment, a mask protection layer 220 may be formed on the top surface of the initial gate structure 210. The mask protection layer 220 may be made of silicon nitride, etc.

In one embodiment, along the height direction of the initial gate structure 210, the ratio between the size of the first initial sidewall surface region A and the size of the second initial sidewall surface region B may be in range of approximately 1:19 to 1:1. The first initial sidewall surface region A may determine the height of the subsequently formed first sidewall spacers. The second initial sidewall surface region B may determine the height of the subsequently formed second sidewall spacers.

After forming the initial gate structure 210, first sidewall spacers may be formed on the first initial sidewall surface region A of the initial gate structure 210, and second sidewall spacers may be formed on the second initial sidewall surface region B of the initial gate structure 210. The second sidewall spacers may be formed on the top surfaces of the first sidewall spacers. The first sidewall spacers and the second sidewall spacers may be made of different materials.

The process for forming the first sidewall spacers on the first initial sidewall surface region A and the second sidewall spacers on the second initial sidewall surface region B may include forming an initial sidewall spacer material layer on the first initial sidewall surface region A of the initial gate structure 210 and the second initial sidewall surface region B of the initial gate structure 210; and forming a protective layer on the initial gate structure 210 and the surface of the semiconductor substrate 200 around the initial gate structure 210. The protective layer may cover the portion of the initial sidewall spacer material layer on the first initial sidewall surface region A and may not cover the portion of the initial sidewall spacer material layer on the second initial sidewall surface region B. After forming the protective layer, the portion of the initial sidewall spacer material layer on the second sidewall surface region B may be removed to form the first sidewall spacers on the first initial sidewall surface region A. Then, second sidewall spacers may be formed on the second sidewall surface region B and on the top surfaces of the first sidewall spacers. After forming the second sidewall spacers, the protective layer may be removed.

Figure 4:
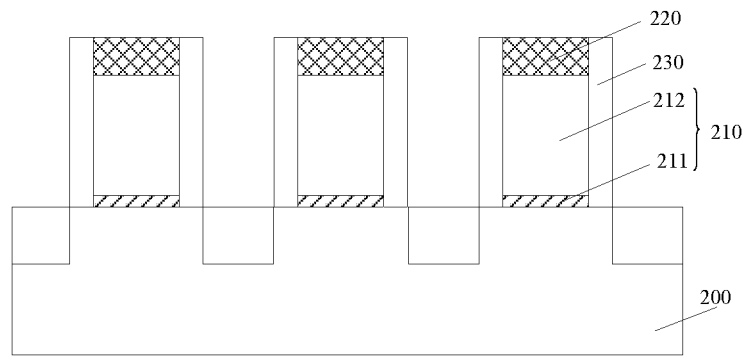

In particular, returning to FIG. 25, after forming the initial gate structure, an initial sidewall spacer material layer may be formed (S102). FIG. 4 illustrates a corresponding semiconductor structure.

As shown in FIG. 4, an initial sidewall spacer material layer 230 may be formed on the first initial sidewall surface region A of the initial gate structure 210 and the second initial sidewall surface region B of the initial gate structure 210. In one embodiment, the initial sidewall spacer material layer 230 may also be formed on the sidewall surfaces of the mask protection layer 220.

The initial sidewall spacer material layer 230 may be made of silicon nitride, silicon oxynitride, silicon oxycarbonitride, or silicon oxide, etc. A thickness of the initial sidewall spacer material layer 230 may be in a range of approximately 3 nm-50 nm.

In one embodiment, after forming the initial sidewall spacer material layer, doped source/drain regions (not labeled) may be formed in the semiconductor substrate 200 at both sides of the initial gate structure 210 and the initial sidewall spacer material layer 230.

Figure 5:
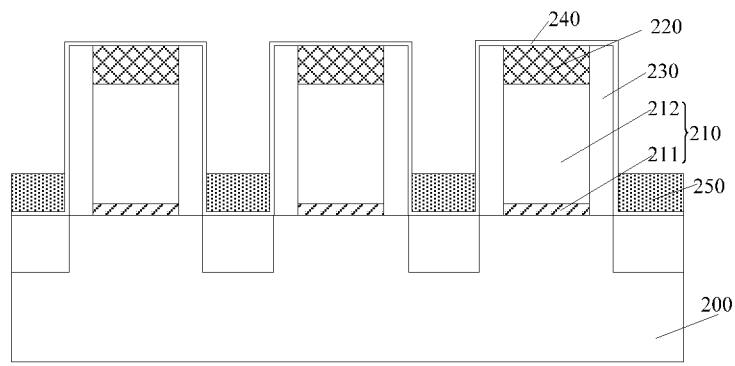

Returning to FIG. 25, after forming the initial sidewall spacer material layer, a protective layer may be formed (S103). FIG. 5 illustrates a corresponding semiconductor structure.

As shown in FIG. 5, a protective layer 250 is formed on the initial sidewall spacer material layer 230 and on the surface of the semiconductor substrate 200 around the initial gate structure 210. In one embodiment, an initial liner layer 240 may be formed on the surface of the of the initial sidewall spacer material layer 230 and the surface of the initial gate structure 210 and the surface of the semiconductor substrate 200. The protective layer 250 may cover the initial liner layer 240 on the surface of the semiconductor substrate 200 and a portion of the initial liner layer 240 on the initial sidewall spacer material layer 230.

The protective layer 250 may cover the portion of the initial sidewall spacer material layer 230 on the first sidewall surface region A; and may not cover the surface of the initial sidewall spacer material layer 230 on the second sidewall surface region B. In one embodiment, the top surface of the protective layer 250 may level with the top of the first initial sidewall surface region A.

The process for forming the protective layer 250 may include forming an initial protective material layer on the initial gate structure 210, the surface of the semiconductor substrate 200 around the initial gate structure 210 and the surface of the initial sidewall spacer material layer 230; planarizing the initial protective material layer to remove the portions of the initial protective material layer on the initial gate structure 210 and the initial sidewall spacer material layer 230; and etching-back the portions of the initial protective material layer on the initial gate structure 210 and the surface of the semiconductor substrate 200 around initial sidewall spacer material layer 230 to reduce the height of the initial protective material layer to a pre-determined value to form the protective layer 250.

The initial protective material layer may be formed by any appropriate process, such as a deposition process, etc. The deposition process may be a plasma-enhanced chemical vapor deposition (PECVD) process, or a spin-coating process, etc.

The protective layer 250 may be made of a material different from that of the subsequently formed second sidewall spacers and that of the first sidewall spacers. In one embodiment, the protective material layer is made of silicon oxide, or polysilicon, etc.

In one embodiment, the initial liner layer 240 may be formed on the surface of the of the initial sidewall spacer material layer 230 and the surface of the initial gate structure 210 and the surface of the semiconductor substrate 200. Thus, the protective material layer 250 may be formed on the initial liner layer 240. Accordingly, the protective layer 250 may cover the initial liner layer 240 on the surface of the semiconductor substrate 200 and a portion of the initial liner layer 240 on the initial sidewall spacer material layer 230. The initial liner layer 240 may be used as an etching stop layer during the subsequent process for forming conductive plugs.

In one embodiment, the initial liner layer 240 is formed after forming the doped source/drain regions. Thus, the initial liner layer 240 may cover the surfaces of the doped source/drain regions.

The initial liner layer 240 and the protective layer 250 may be made of different materials. The initial liner layer 240 may be made of silicon nitride, silicon oxynitride, silicon oxycarbonitride, or silicon oxide, etc.

The thickness of the initial liner layer 240 may be in a range of approximately 1 nm-30 nm. The initial liner layer 240 may be used to form a liner layer. In some embodiments, the initial liner layer may be omitted.

Figure 6:
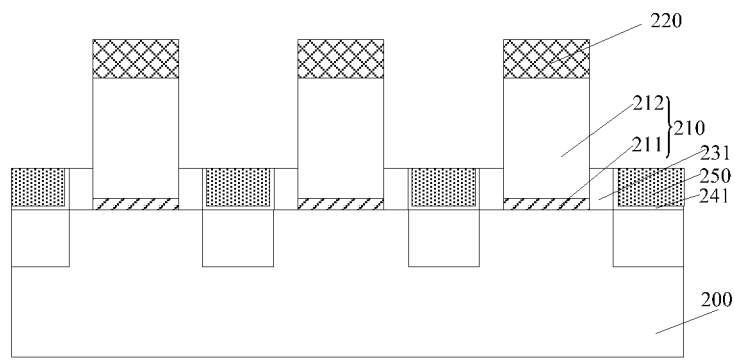

Returning to FIG. 25, after forming the protective layer, first sidewall spacers may be formed (S104). FIG. 6 illustrates a corresponding semiconductor structure.

As shown in FIG. 6, after forming the protective layer 250, the portion of the initial sidewall spacer material layer 230 on the second initial sidewall spacer region B may be removed. The initial sidewall spacer material layer 230 on the first initial sidewall spacer region A may form first sidewall spacers 231.

The first sidewall spacers 231 may be made of silicon nitride, silicon oxynitride, silicon oxycarbonitride, or silicon oxide, etc. The thickness of the first sidewall spacers 231 may be in a range of approximately 3 nm-50 nm.

In one embodiment, the first sidewall spacers 231 are made of silicon nitride. The height of the first sidewall spacers 231 may be greater than the thickness of the subsequently formed gate dielectric layer. In particular, the height of the first sidewall spacers 231 may be greater than the thickness of the gate dielectric layer subsequently formed on the surface of the semiconductor substrate 200 such that the first sidewall spacers 231 may entirely cover the sidewall surfaces of the gate dielectric layer subsequently formed on the surface of the semiconductor substrate 200. The height of the first sidewall spacers 231 may refer to as the size of the first sidewall spacers 231 along the direction perpendicular to the surface of the semiconductor substrate 200.

In one embodiment, the initial liner layer 240 on the second initial sidewall surface region B and on the initial gate structure 210 may be etched to form a liner layer 241 on the surface of the semiconductor substrate 200 and the first initial sidewall surface region A. The liner layer 241 may be made of a material the same as that of the initial liner layer 240; and the thickness of the liner layer 241 may be the same as the thickness of the initial liner layer 240.

Figure 7:
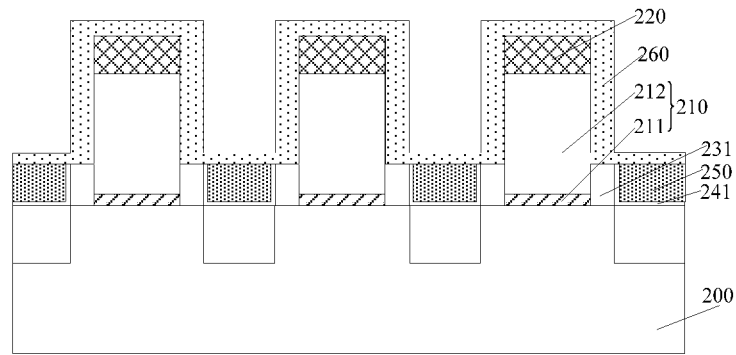
Figure 8:
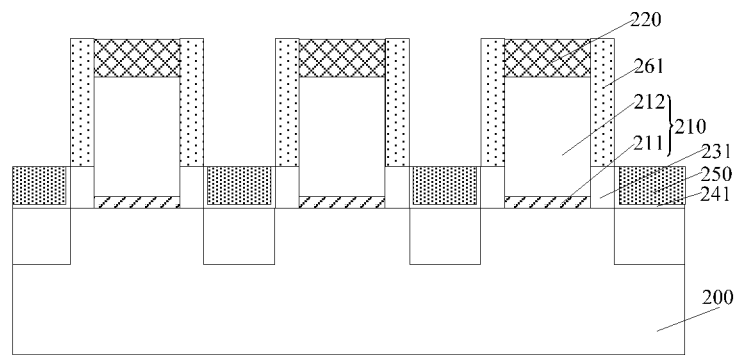
Figure 9:
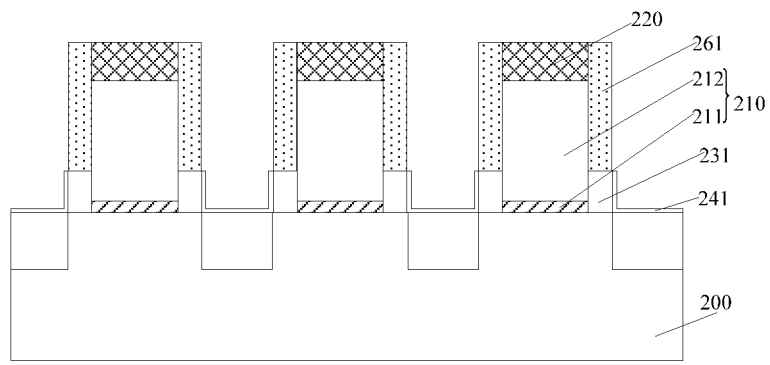

After forming the first sidewall spacers 231, second sidewall spacers may be formed on the top surfaces of first sidewall spacers 231 and on the second sidewall surface region B. A process for forming the second sidewall spacers on the top surfaces of first sidewall spacers 231 and on the second sidewall surface region B may include forming a second initial sidewall spacer material layer on the sidewall surface region B, the top surface of the initial gate structure 210 and the surface of the protective layer 250; and etching back the second sidewall spacer material layer until the surface of the protective layer 250 and the top surface of the initial gate structure 210 are exposed. FIGS. 7-8 illustrate the structures corresponding to certain stages during the process for forming the second sidewall spacers.

In particular, returning to FIG. 25, after forming the first sidewall spacers, second sidewall spacers may be formed (S105). FIGS. 7-8 illustrate structures corresponding to certain stages during forming the second sidewall spacers.

As shown in FIG. 7, a second initial sidewall spacer material layer 260 may be formed on the second initial sidewall surface region B, the top surface of the initial gate structure 210, the top surfaces of the first sidewall spacers 231 and the top surface of the protective layer 250. In one embodiment, the liner layer 241 is formed on the sidewall surfaces of the first sidewall spacers 231, the second initial sidewall spacer material layer 260 may also be formed on the top surface of the liner layer 241. Further, the second initial sidewall spacer material layer 260 may also be formed on the top and sidewall surfaces of the protective layer 220.

The second initial sidewall spacer material layer 260 may be formed by a deposition process, such as a PECVD process, or an atomic layer deposition (ALD) process, etc. The second initial sidewall spacer material layer 260 and the first sidewall spacers 231 may be made of different materials. The second initial sidewall spacer material layer 260 may be used to subsequently form second sidewall spacers.

The second initial sidewall spacer material layer 260 may be made of any appropriate material, such as silicon nitride, silicon oxynitride, silicon oxycarbonitride, or silicon oxide, etc. In one embodiment, the second initial sidewall spacer material layer 260 is made of silicon oxide.

After forming the second initial sidewall spacer material layer 260, an etching-back process may be performed on the second initial sidewall spacer material layer 260 until the surface of the protective layer 250 and the top surface of the mask protection layer 220 are exposed. Thus, the second sidewall spacers 261 may be formed on the top surfaces of the first sidewall spacers 231 and to cover the second initial sidewall surface region B. In one embodiment, the second sidewall spacers 261 may also cover the sidewall surfaces of the mask protection layer 220.

The second sidewall spacers 261 and the first sidewall spacers 231 may be made of different materials. The second sidewall spacers 261 may be made of silicon nitride, silicon oxynitride, silicon oxycarbonitride, or silicon oxide, etc. In one embodiment, the second initial sidewall spacers 261 are made of silicon oxide.

In one embodiment, the thickness of the second sidewall spacers 261 may be equal to the thickness of the first sidewall spacers 231. In some embodiments, the thickness of the second sidewall spacers may be greater or smaller than the thickness of the first sidewall spacers. When the thickness of the second sidewall spacers 261 is greater than the thickness of the first sidewall spacers 231, the lateral size of the subsequently formed air gap spacers may be substantially large.

Further, as shown 9, after forming the second sidewall spacers 261, the protective layer 250 (referring to FIG. 8) may be removed. The protective layer 250 may be removed by any appropriate process, such as a dry etching process, or a wet etching process, etc.

Figure 10:
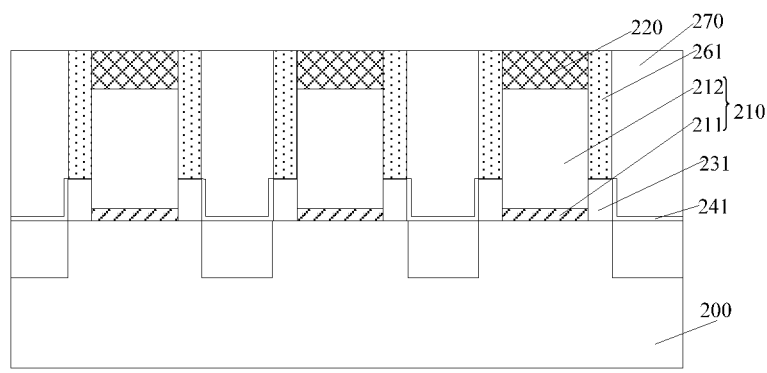

Returning to FIG. 25, after removing the protective layer, a first dielectric layer may be formed (S106). FIG. 10 illustrates a corresponding semiconductor structure.

As shown in FIG. 10, a first dielectric layer 270 is formed on the surface of the semiconductor substrate 200 around the initial gate structure 210, the first sidewall spacers 231 and the second sidewall spacers 261. When the liner layer 241 is formed on the surface of the semiconductor substrate 200, the first dielectric layer 270 may also be formed on the liner layer 241.

The first dielectric layer 270 may be made of any appropriate material, such as silicon oxide or low-K dielectric material. The low-K dielectric material refers to a dielectric material having a relative dielectric constant (K) smaller than 3.9.

Figure 11:
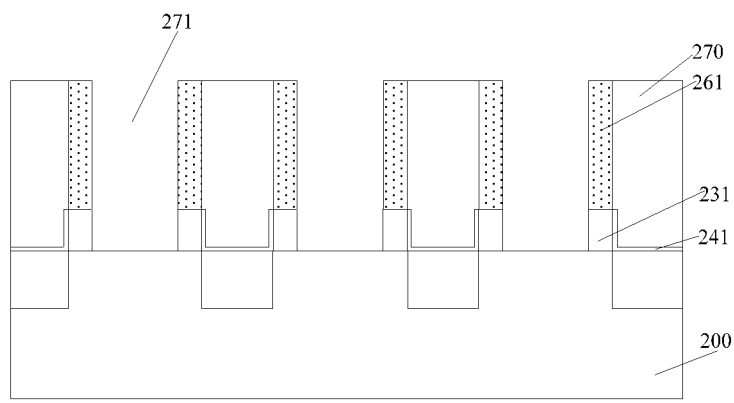

Returning to FIG. 25, after forming the first dielectric layer, the initial gate structure may be removed (S107). FIG. 11 illustrates a corresponding semiconductor structure.

As shown in FIG. 11, the initial gate structure 210 may be removed; and a first gate opening 270 may be formed in the first dielectric layer 270. In one embodiment, before removing the initial gate structure 210, the mask protection layer 220 may be removed (referring to FIG. 10).

In one embodiment, the initial gate dielectric layer 211 may be made of silicon oxide. The gate opening 271 may be formed by removing the initial gate structure 210; and a gate structure may be subsequently formed in the gate opening 271.

In some embodiments, the initial gate dielectric layer may be made of a high-K dielectric material. After removing the initial gate structure to form the gate opening, the initial gate dielectric layer may be used as a gate dielectric layer. A gate electrode layer may be subsequently formed in the gate opening. The gate electrode layer and the gate dielectric layer may be together used as a gate structure.

Figure 12:
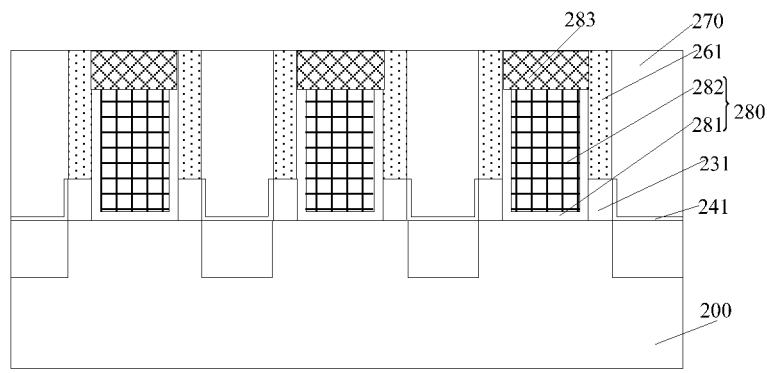

Returning to FIG. 25, after forming the gate opening, a gate structure may be formed in the gate opening (S108). FIG. 12 illustrates a corresponding semiconductor structure.

As shown in FIG. 12, a gate structure 280 may be formed in the gate opening 271. In one embodiment, the gate structure 280 may include a gate dielectric layer 281 formed on the sidewall surfaces of the gate opening 271 and the bottom of the gate opening 271, and a gate electrode layer 282 formed on the gate dielectric layer 281. The gate dielectric layer 281 may be made of a high-K dielectric material. The gate electrode layer 282 may be made of a metal material. In some embodiments, the gate structure may include a gate dielectric layer formed on the bottom of the gate opening and a gate electrode layer formed on the gate dielectric layer. In particular, the gate structure may include the gate dielectric layer on the surface of the semiconductor substrate.

The sidewall surface of the gate structure 280 may include a first sidewall surface region (not labeled) and a second sidewall surface region (not labeled) above the first sidewall surface region. The first sidewall spacers 231 may be formed on the first sidewall surface region and may not be formed on the second sidewall surface region. The second sidewall spacers 261 may be formed on the second sidewall surface region and may not be formed on the first sidewall surface region. The first sidewall spacers 231 may be on the sidewall surfaces of the gate dielectric layer 281 on the surface of the semiconductor substrate 200.

In one embodiment, the height of the first sidewall surface region may be equal to the height of the first initial sidewall surface region A. The height of the second sidewall surface region may be equal to the height of the second initial sidewall surface region B. Along the height direction of the gate structure 280, the ratio between the size of the first sidewall surface region and the size of the second sidewall surface region may be in a range of approximately 1:19 to 1:1.

Referring to FIG. 12, the top surface of the gate structure 280 may be lower than the top surface of the first dielectric layer 270. In one embodiment, a gate protection layer 283 may be formed on the top surface of the gate structure 280 and in the gate opening 271. The gate protection layer 283 may be made of any appropriate material, such as silicon nitride, etc. The second sidewall spacers 261 may cover the sidewall surfaces of the gate protection layer 283.

Figure 13:
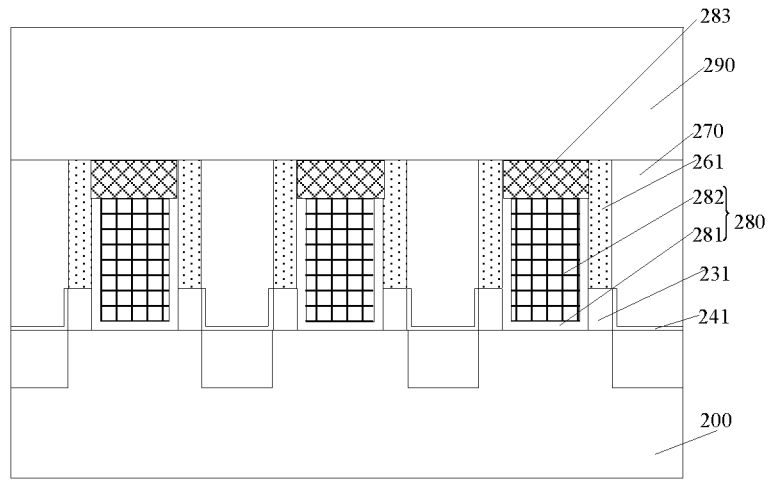

Returning to FIG. 25, after forming the gate structure, a second dielectric layer may be formed (S109). FIG. 13 illustrates a corresponding semiconductor structure.

As shown in FIG. 13, a second dielectric layer 290 is formed over the gate structure 280, the second sidewall spacers 261 and the first dielectric layer 270.

Figure 14:
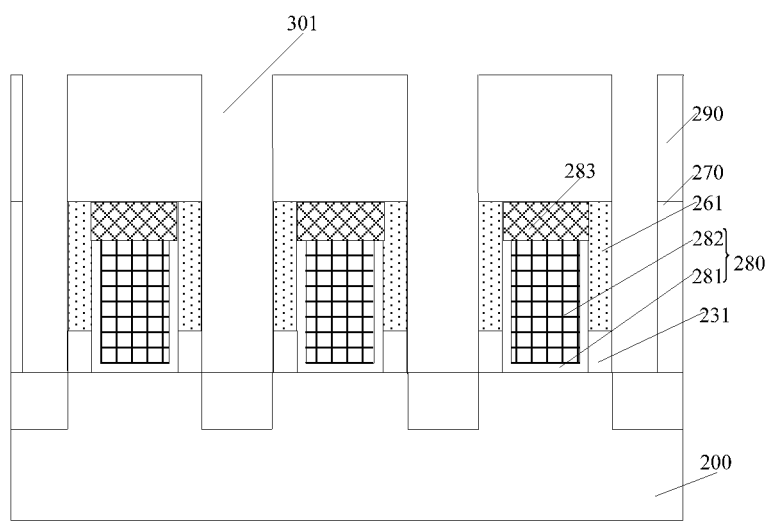
Figure 15:
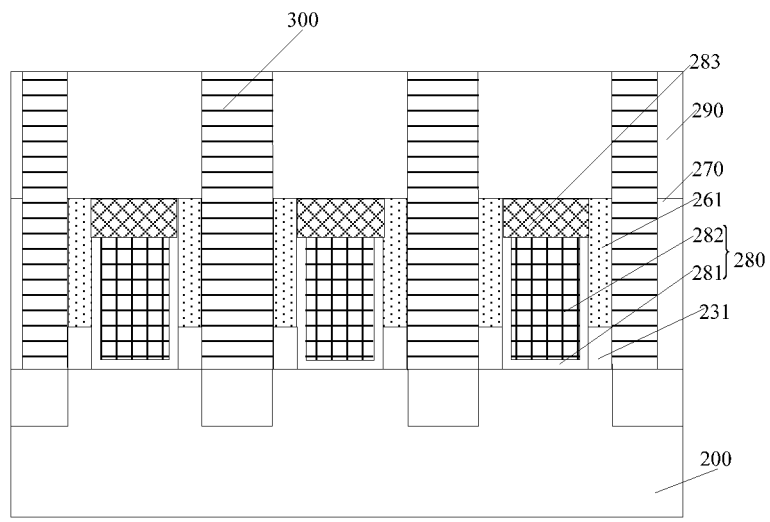

Returning to FIG. 25, after forming the second dielectric layer, conductive plugs may be formed (S110). FIGS. 14-15 illustrate structures corresponding certain stages during the process for forming the conductive plugs.

As shown in FIG. 14, after forming the second dielectric layer 290, contact holes 301 may be formed in the second dielectric layer 290 and the first dielectric layer 270 at both sides of the gate structure 280, the first sidewall spacers 231 and the second sidewall spacers 261. The contact holes 301 may expose the sidewall surfaces of the first sidewall spacers 231 and the second sidewall spacers 261.

In one embodiment, the liner layer 241 may also be removed during forming the conductive plugs. In particular, the liner layer 241 may be removed after forming the contact holes 301 and before forming conductive plugs in the contact holes 301.

Further, as shown in FIG. 15, after forming the contact holes 301, a conductive plug 300 may be formed in each of the contact holes 301. In particular, the conductive plugs 300 may be formed in the first dielectric layer 270 at both sides of the gate structure 280, the first sidewall spacers 231 and the second sidewall spacers 261.

Further, the conductive plugs 300 may also extend into the second dielectric layer 290. The conductive plugs 300 may be formed on the doped source/drain regions.

Figure 16:
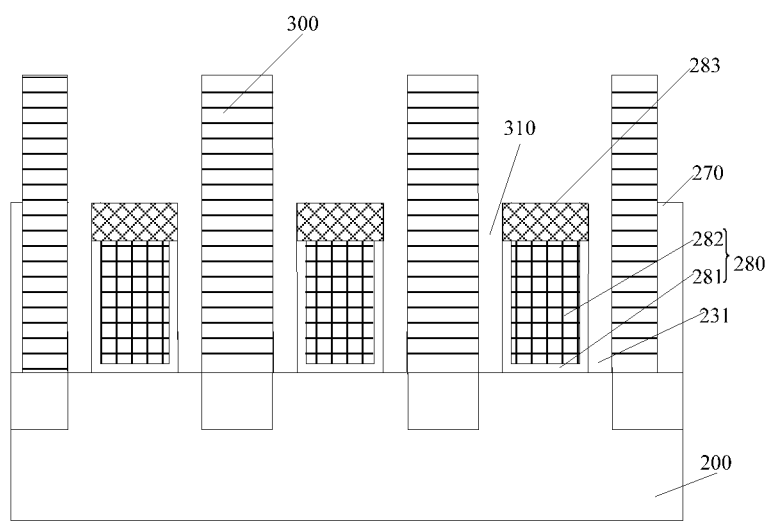

Returning to FIG. 25, after forming the conductive plugs, air gap spacers may be formed (S111). FIG. 16 illustrates a corresponding semiconductor structure.

As shown in FIG. 16, after forming the conductive plugs 300, the second dielectric layer 290 may be removed. Then, the second sidewall spacers 261 may be removed by an etching process, and air gap spacers 310 may be formed between the second sidewall surface region of the gate structure 280 and the conductive plugs 300 and above the first sidewall spacers 231. The air gap spacers 310 may reduce the parasitic capacitance between the gate structure 280 and the conductive plugs 300.

The etching rate of the process for etching the second sidewall spacers 261 to the second sidewall spacer 261 may be greater than the etching rate to the first sidewall spacers 231. In particular, the ratio between the etching rate to the second sidewall spacer 261 and the etching rate to the first sidewall spacers 231 may be greater than 20.

In one embodiment, the air gap spacers 310 may expose the second sidewall surface region of the gate structure 280 and portions of the sidewall surfaces of the conductive plugs 300.

Figure 17:
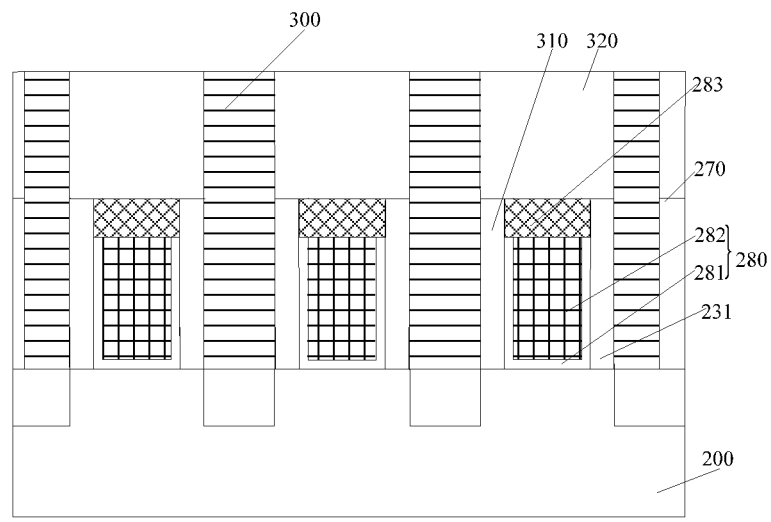

After forming the air gap spacers 310, as shown in FIG. 17, a third dielectric layer 270 may be formed over the air gap spacers 310 and the first dielectric layer 270. In one embodiment, the third dielectric layer 320 may also be formed on the gate protection layer 283.

The present disclosure also provides a semiconductor device. FIG. 17 illustrates a corresponding semiconductor device.

As shown in FIG. 17, the semiconductor device may include a semiconductor substrate 200; and at least one gate structure 280 formed on the semiconductor substrate 200. The gate structure 280 may include a gate dielectric layer 281 formed on the surface of the semiconductor substrate 200. The sidewall surfaces of the gate structure 280 may include a first sidewall surface region and a second sidewall surface region above the first sidewall surface region. The semiconductor device may also include first sidewall spacers 231 formed on the first sidewall spacer region and on the sidewall surfaces of the gate dielectric layer 281; and a first dielectric layer 270 formed on the gate structure 280 and the surface of the semiconductor substrate 200 around the first sidewall spacers 231. Further, the semiconductor device may include conductive plugs 300 formed in the first dielectric layer 270 at both sides of the gate structure 280 and the first sidewall spacers 231 and air gap spacers 310 between the second sidewall surface region of the gate structure 280 and the conductive plugs 300 and above the first sidewall spacers 231. The detailed structures and intermediate structures are described above with respect to the fabrication process.

Along the height direction of the gate structure 280, a ratio between the size of the first sidewall surface region and the size of the second sidewall surface region may be in a range of approximately 1:19-1:1.

The present disclosure also provides another fabrication method of a semiconductor device. Comparing with the previously described method, the major difference may include forming a gate structure, protective sidewall spacers and sacrificial sidewall spacers. The gate structure may be formed on the semiconductor substrate. The gate structure may include a gate dielectric layer on the surface of the semiconductor substrate. The protective sidewall spacers may be formed on the sidewall surfaces of the gate structure and cover the sidewall surfaces of the gate dielectric layer. The sacrificial sidewall spacers may be formed on the sidewall surfaces of the protective sidewall spacers and the protective sidewall spacers may be formed between the gate structure and the sacrificial sidewall spacers. The first dielectric layer may be formed on the gate structure, the protective sidewall spacers and the surface of the semiconductor substrate around the sacrificial sidewall spacers. Further, conductive plugs may be formed in the first dielectric layer at both sides of the gate structure, the protective sidewall spacers and the second sidewall spacers. Then, the sacrificial sidewall spacers may be removed; and air gap spacers may be formed between the protective sidewall spacers and the conductive plugs.

In particular, FIGS. 18-24 illustrate structures corresponding certain stages during another exemplary fabrication process of a semiconductor structure consistent with various disclosed embodiments.

Figure 18:
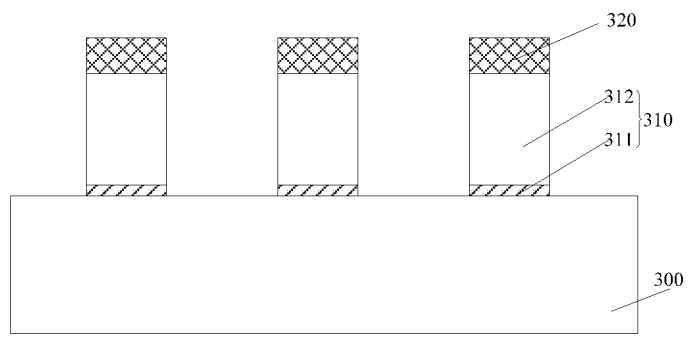
FIGS. 18-24B illustrate structures corresponding to certain stages during another exemplary fabrication process of a semiconductor device consistent with various disclosed embodiments.

As shown in FIG. 18, at the beginning of the fabrication process, a semiconductor substrate 300 is provided. At least one initial gate structure 310 may be formed on the surface of the semiconductor substrate 300. For illustrative purposes, three initial gate structures 310 are illustrated.

The details of the semiconductor substrate 300 may refer to the semiconductor substrate 200.

The initial gate structure 310 may include an initial gate dielectric layer 311 formed on the surface of the semiconductor substrate 300 and an initial gate electrode layer 312 formed on the initial gate dielectric layer 311. The initial gate dielectric layer 311 may be made of silicon oxide or high-K (K≥3.9) dielectric material, etc. The initial gate electrode layer 312 may be made of polysilicon, etc.

In one embodiment, a mask protection layer 320 may be formed on the surface of the initial gate structure 310. The mask protection layer 320 may be made of silicon nitride.

Figure 19:
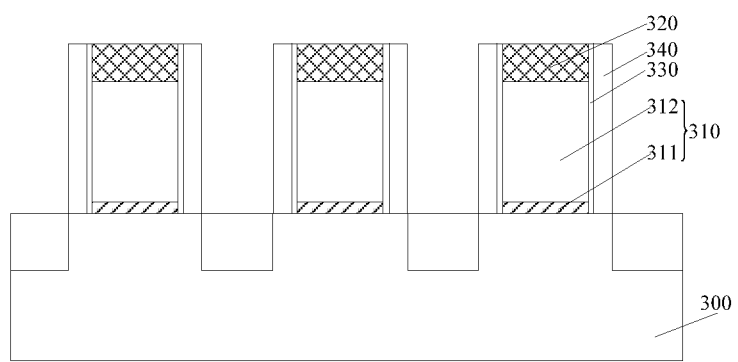

Further, as shown in FIG. 19, protective sidewall spacers 330 may be formed on the sidewall surfaces of the initial gate structure 310; and sacrificial sidewall spacers 340 may be formed on the sidewalls surfaces of the protective sidewall spacers 330. The sacrificial sidewall spacers 340 and the protective sidewall spacers 330 may be made of different materials.

The process for forming the protective sidewall spacers 330 may include forming a protective sidewall spacer material layer on the sidewall surfaces and the top surface of the initial gate structure 330 and the surface of the semiconductor substrate 300; and etching back the protective sidewall spacer material layer until the surface of the semiconductor substrate 300 is exposed.

The process for forming the sacrificial sidewall spacers 340 may include forming a sacrificial sidewall spacer material layer on the sidewall surfaces of the protective sidewall spacers 330 and the top surface of the initial gate structure 330 and the surface of the semiconductor substrate 300; and etching back the sacrificial sidewall spacer material layer until the surface of the semiconductor substrate 300 is exposed.

The protective sidewall spacers 330 may be made of silicon nitride, silicon oxynitride, silicon oxycarbonitride, or silicon oxide, etc. The sacrificial sidewall spacers 340 may be made of silicon nitride, silicon oxynitride, silicon oxycarbonitride, or silicon oxide, etc.

In one embodiment, the thickness of the protective sidewall spacers 330 may be in a range of approximately 1 nm-12 nm, such as 3 nm, 5 nm, 7 nm, 9 nm, 10 nm, or 12 nm, etc. If the thickness of the protective sidewall spacers 330 is substantially small, the protective function of the protective sidewall spacers 330 to the gate dielectric layer on the surface of the semiconductor substrate 300 may be substantially small. If the thickness of the protective sidewall spacers 330 is substantially large, the protective sidewall spacers 330 may occupy a substantially large space; and the spaces of the subsequently formed air gap spacers may not be enough.

In one embodiment, the protective sidewall spacers 330 may also cover the sidewall surfaces of the mask protection layer 320.

Figure 20:
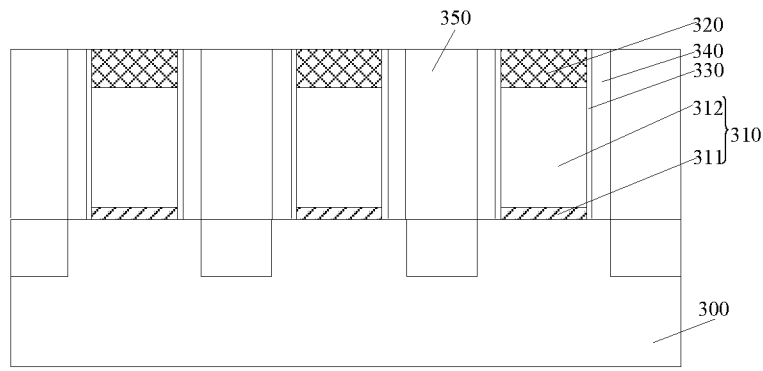

Further, as shown in FIG. 20, after forming the protective sidewall spacers 330 and the sacrificial sidewall spacers 340, a first dielectric layer 350 may be formed on the surface of the semiconductor substrate 300 around the initial gate structure 310, the protective sidewall spacers 330 and the sacrificial sidewall spacers 340.

The first dielectric layer 350 may be made of any appropriate material, such as silicon oxide, or low-K (K<3.9) dielectric material, etc.

Figure 21:
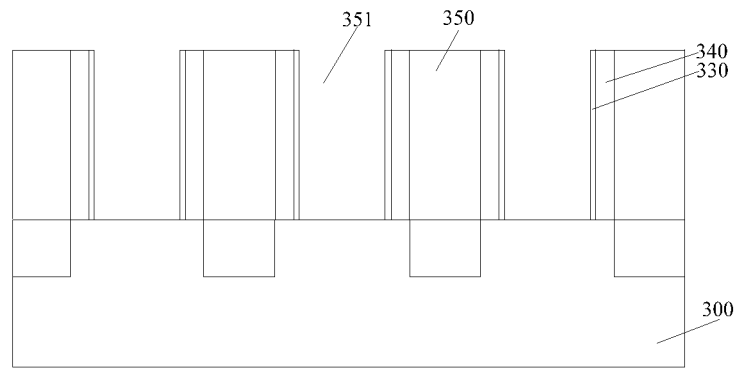

Further, as shown in FIG. 21, after forming the first dielectric layer 350, the initial gate structure 310 may be removed; and a gate opening 351 may be formed in the first dielectric layer 350.

In one embodiment, before removing the initial gate structure 310, the mask protection layer 320 may be removed. The sidewall surfaces of the gate opening 351 may expose the protective sidewall spacers 330.

In one embodiment, the initial gate dielectric layer 311 may be made of silicon oxide. The gate opening 351 may be formed by removing the initial gate structure 310. A gate structure may be subsequently formed in the gate opening 351.

In some embodiments, the initial gate dielectric layer may be made of high-K dielectric material. After removing the initial gate structure to form the gate opening, the initial gate dielectric layer may be configured as the gate dielectric layer. A gate electrode layer may be subsequently formed in the gate opening, the gate dielectric layer and the gate electrode layer may be together used as a gate structure.

Figure 22:
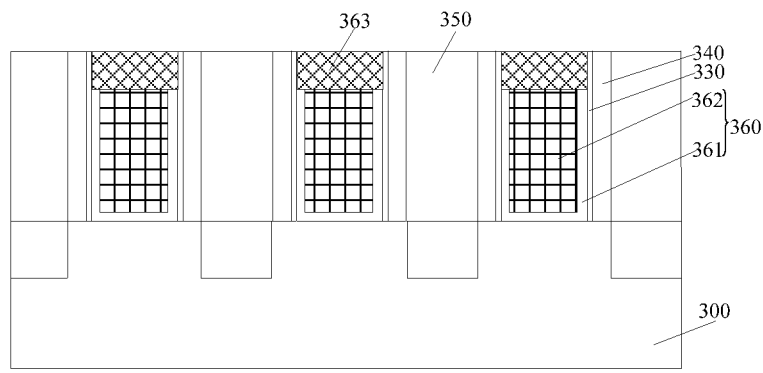

Further, as shown in FIG. 22, after forming gate opening 351 (referring to FIG. 21), a gate structure 360 may be formed in the gate opening 351. In one embodiment, the gate structure 360 may include a gate dielectric layer 361 formed on the bottom and the sidewall surface of the gate opening 351; and a gate electrode layer 362 formed on the gate dielectric layer 361. In some embodiments, the gate structure may include a gate dielectric layer formed on the bottom of the gate opening and a gate electrode layer formed on the gate dielectric layer. Under such two configurations, the gate structure may all include a gate dielectric layer formed on the surface of the semiconductor substrate.

In one embodiment, the protective sidewall spacers 330 may cover entire sidewall surfaces of the gate structure 360.

In one embodiment, the top surface of the gate structure 360 is lower than the top surface of the first dielectric layer 350. A gate protection layer 363 may be formed on the top surface of the gate structure 360 and in the gate opening 351.

Figure 23:
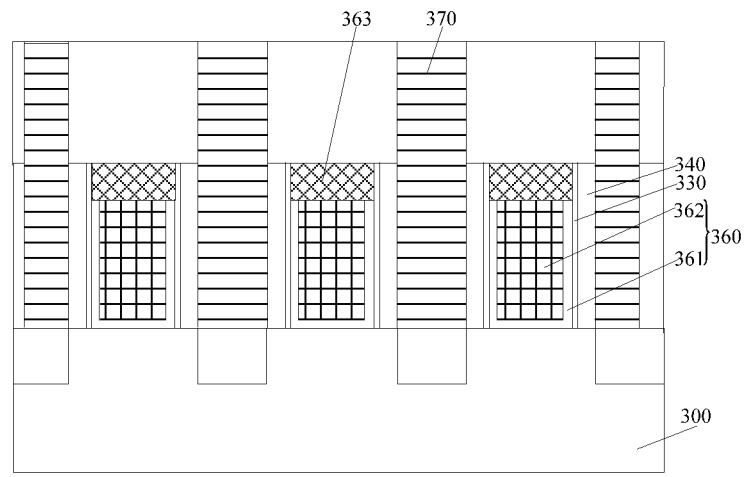

Further, as shown in FIG. 23, conductive plugs 370 may be formed in the first dielectric layer 350 at both sides of the gate structure 360, the protective sidewall spacers 330 and the sacrificial sidewall spacers 340.

In one embodiment, before forming the conductive plugs 370, a second dielectric layer (not labeled) may be formed on the gate structure 360, the protective sidewall spacers 330, the sacrificial sidewall spacers 340 and the first dielectric layer 350. Accordingly, the conductive plugs 370 may also be formed in the second dielectric layer. In one embodiment, the second dielectric layer may also be formed on the gate protection layer 363.

Further, as shown in FIG. 24, after forming the conductive plugs 370, the sacrificial sidewall spacers 340 may be removed; and air gap spacers 380 may be formed between the protective sidewall spacers 330 and the conductive plugs 370.

In one embodiment, after forming the conductive plugs 370, the second dielectric layer may be removed. Then, the sacrificial sidewall spacers 340 may be removed to form the air gap spacers 380. Further, a third dielectric layer 390 may be formed on the gate structure 360, the air gap spacers 380 and the first dielectric layer 350. In one embodiment, the third dielectric layer 390 may also be formed on the gate protection layer 363.

In one embodiment, the air gap spacers 380 may expose the sidewall surfaces of the protective sidewall spacers 330 and the conductive plugs 370.

Figure 24A:
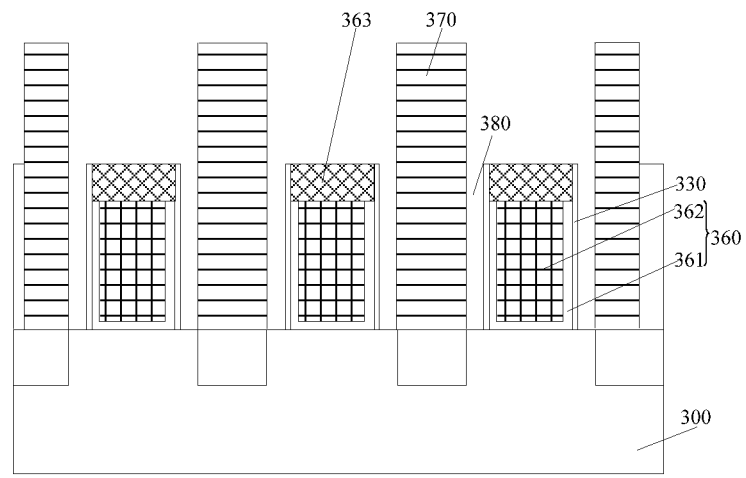
Figure 24B:
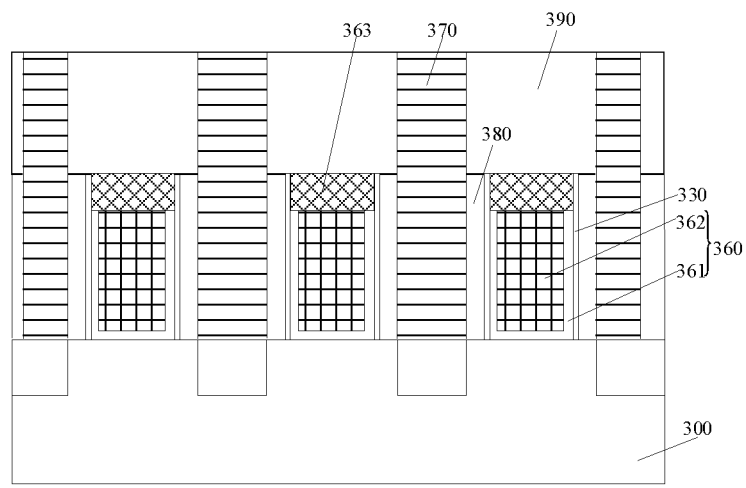

Correspondingly, the present disclosure also provides another semiconductor device. FIGS. 24A and 24B illustrate a corresponding semiconductor device.

As shown in FIGS. 24A and 24B, the semiconductor device may include a semiconductor substrate 300, and at least one gate structure 360 formed on the surface of the semiconductor substrate 300. The gate structure 360 may include a gate dielectric layer 361 formed on the surface of the semiconductor substrate 300 and a gate electrode layer 362 formed on the gate dielectric layer 361. The semiconductor device may also include protective sidewall spacers 330 formed on the sidewall surfaces of the gate structure 360 and covering the sidewall surfaces of the gate dielectric layer 361; and a first dielectric layer 350 formed on the surface of the semiconductor substrate 300 around the gate structure 360 and the protective sidewall spacers 330. Further, the semiconductor device may include conductive plugs 370 formed in the first dielectric layer 350 at both sides of the gate structure 360 and the protective sidewall spacers 330, and air gap spacers 380 formed between the protective sidewall spacers 330 and the conductive plugs 370. The air gap spacers 380 may expose the sidewall surfaces of the protective sidewall spacers 330. The detailed structures and intermediate structures are described above with respect to the fabrication processes.

In one embodiment, the sidewall surfaces of the conductive plugs 370 are also the edges of the air gap spacers 380. The protective sidewall spacers 330 may be made of silicon nitride, silicon oxynitride, silicon oxy carbon nitride, or silicon oxide, etc. The thickness of the protective sidewall spacers 330 may be in a range of approximately 1 nm-12 nm.

In the disclosed fabrication method, first sidewall spacers and second sidewall spacers may be formed. The first sidewall spacers may be formed on the first sidewall surface region of the gate structure; the second sidewall spacers may be formed on the second sidewall surface region of the gate structure; and the second sidewall spacers may be formed on the top surfaces of the first sidewall spacers. The air gap spacers may be formed by removing the second sidewall spacers using an etching process. The air gap spacers may reduce the capacitance between the gate structure and the conductive plugs. Because the second sidewall spacers and the first sidewall spacers may be made of different materials, during the process for removing the second sidewall spacers, the first sidewall spacers may not be removed. The first sidewall spacers may protect the gate dielectric layer on the surface of the semiconductor substrate. Thus, the damages caused by the process for forming the air gap spacers may be avoided; and the performance of the semiconductor devices may be improved.

In the disclosed semiconductor device, first sidewall spacers may be formed the first sidewall surface region of the gate structure. The air gap spacers may be formed between the second sidewall surface region and conductive plugs; and the air gap spacers may be over the first sidewall spacers. The air gap spacers may reduce the parasitic capacitance between the gate structure and the conductive plugs. The first sidewall spacers may protect the gate dielectric layer on the surface of the semiconductor substrate. The sidewall surfaces of the gate dielectric layer on the surface of the semiconductor substrate may not be the edges of the air gap spacers. Thus, the damages to the gate dielectric layer on the surface of the semiconductor substrate may be avoided; and the performance of the semiconductor devices may be improved.

In another disclosed fabrication method, protective sidewall spacers and sacrificial sidewall spacers may be formed. The protective sidewall spacers may be formed on the sidewall surfaces of the gate structure; and the sacrificial sidewall spacers may be formed on the protective sidewall spacers; and the protective sidewall spacers may be formed between the gate structure and the sacrificial sidewall spacers. The air gap spacers may be formed by removing the sacrificial sidewall spacers using an etching process. The air gap spacers may reduce the parasitic capacitance between the gate structure and the conductive plugs. Because the second sidewall spacers and the first sidewall spacers may be made of different materials, during the process for removing the second sidewall spacers, the first sidewall spacers may not be removed. The first sidewall spacers may protect the gate dielectric layer on the surface of the semiconductor substrate. Thus, the damages caused by the process for forming the air gap spacers may be avoided; and the performance of the semiconductor devices may be improved.

In another disclosed semiconductor device, protective sidewall spacers may be formed on the sidewall surface of the gate structure. The air gap spacers may be formed between the protective sidewall spacers and the conductive plugs. The air gap spacers may reduce the parasitic capacitance between the gate structure and the conductive plugs. The first sidewall spacers may protect the gate dielectric layer on the surface of the semiconductor substrate. The sidewall surfaces of the gate dielectric layer on the surface of the semiconductor substrate may not be the edges of the air gap spacers. Thus, the damages to the gate dielectric layer on the surface of the semiconductor substrate may be avoided; and the performance of the semiconductor devices may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor device, comprising:
    providing a semiconductor substrate;
    forming a gate structure on a surface of the semiconductor substrate, wherein the gate structure includes a gate dielectric layer formed on the surface of the semiconductor substrate;
    forming protective sidewall spacers on sidewall surfaces of the gate structure and to cover sidewall surfaces of the gate dielectric layer;
    forming sacrificial sidewall spacers on sidewall surfaces of the protective sidewall spacers, the protective sidewall spacers being located between the sacrificial sidewall spacers and the gate structure, wherein the sacrificial sidewall spacers and the protective sidewall spacers are made of different materials;
    forming a first dielectric layer on the surface of the semiconductor substrate around the gate structure, the protective sidewall spacers, and the sacrificial sidewall spacers;
    forming a second dielectric layer on the gate structure, the protective sidewall spacers, and the sacrificial sidewall spacers;
    forming conductive plugs in the first dielectric layer at opposite sides of the gate structure, the protective sidewall spacers, and the sacrificial sidewall spacers;
    after the conductive plugs are formed, removing the second dielectric layer; and
    removing the sacrificial sidewall spacers to form air gap spacers between the protective sidewall spacers and the conductive plugs.

2. The method according to claim 1, wherein forming the gate structure, the protective sidewall spacers, the sacrificial sidewall spacers, and the first dielectric layer comprises:
    forming an initial gate structure on the surface of the semiconductor substrate;
    forming the protective sidewall spacers on sidewall surfaces of the initial gate structure;
    forming the sacrificial sidewall spacers on sidewall surfaces of the protective sidewall spacers;
    forming the first dielectric layer on the surface of the semiconductor substrate around the initial gate structure, the protective sidewall spacers, and the sacrificial sidewall spacers;
    removing the initial gate structure to form a gate opening in the first dielectric layer; and
    forming the gate structure in the gate opening.

3. The method according to claim 2, wherein forming the protective sidewall spacers comprises:
    forming a protective sidewall spacer material layer on sidewall surfaces and top surfaces of the initial gate structure and on the surface of the semiconductor substrate; and
    etching back the protective sidewall spacer material layer until the surface of the semiconductor substrate is exposed.

4. The method according to claim 3, wherein forming the protective sidewall spacers comprises:
    forming a sacrificial sidewall spacer layer on sidewall surfaces of the protective sidewall spacers, top surfaces of the protective sidewall spacers and the initial gate structure, and the surface of the semiconductor substrate; and
    etching back the sacrificial sidewall spacer material layer until the surface of the semiconductor substrate is exposed.

5. The method according to claim 1, wherein:
    the protective sidewall spacers are made of one of silicon nitride, silicon oxynitride, silicon oxycarbonitride and silicon oxide; and
    the sacrificial sidewall spacers are made of one of silicon nitride, silicon oxynitride, silicon oxycarbonitride and silicon oxide.

6. The method according to claim 1, wherein:
    a thickness of the protective sidewall spacers is in a range of approximately 1 nm-12 nm.

7. The method according to claim 1, wherein:
    the conductive plugs are also formed in the second dielectric layer;
    the sacrificial sidewall spacers are removed by an etching process to form the air gap spacers after removing the second dielectric layer; and
    forming a third dielectric layer over the air gap spacers and on the first dielectric layer.

8. The method according to claim 1, wherein:
    the protective sidewall spacers contact air contained in the air gap spacers.

9. The method according to claim 2, wherein forming the gate structure, the protective sidewall spacers, the sacrificial sidewall spacers, and the first dielectric layer further comprises:
    before forming the protective sidewall spacers, forming a mask protection layer on the initial gate structure, wherein the protective sidewall spacers are located on sidewall surfaces of the mask protection layer; and
    removing the mask protection layer before removing the initial gate structure.

* * * * *